United States Patent [19]

Carobolante

[11] Patent Number: 5,374,857
[45] Date of Patent: Dec. 20, 1994

[54] CIRCUIT FOR PROVIDING DRIVE CURRENT TO A MOTOR USING A SENSEFET CURRENT SENSING DEVICE AND A FAST AMPLIFIER

[75] Inventor: Francesco Carobolante, Phoenix, Ariz.

[73] Assignee: SGS-Thomson Microelectronics, Inc., Carrollton, Tex.

[21] Appl. No.: 890,945

[22] Filed: May 29, 1992

[51] Int. Cl.[5] .............................................. H03K 3/01
[52] U.S. Cl. ................................. 327/110; 327/581; 327/427; 327/432
[58] Field of Search ................ 307/248, 270, 299.1, 307/299.2, 304, 570, 571, 575

[56] References Cited

U.S. PATENT DOCUMENTS

| | | | |
|---|---|---|---|
| 4,427,903 | 1/1984 | Sugimoto | 307/355 |
| 4,667,121 | 5/1987 | Fay et al. | 307/580 |
| 4,675,561 | 6/1987 | Bowers et al. | 307/570 |
| 4,937,469 | 6/1990 | Larson et al. | 307/270 |
| 5,032,745 | 7/1991 | Izadinia et al. | 307/571 |
| 5,061,863 | 10/1991 | Mori et al. | 307/299.2 |
| 5,079,456 | 1/1992 | Kotowski et al. | 307/571 |
| 5,081,379 | 1/1992 | Korteling | 307/530 |
| 5,220,207 | 6/1993 | Kovalcik et al. | 307/350 |

*Primary Examiner*—Timothy P. Callahan
*Assistant Examiner*—Terry D. Cunningham
*Attorney, Agent, or Firm*—Richard A. Bachand; Joseph Arrambide; Lisa K. Jorgenson

[57] ABSTRACT

A circuit for providing drive current to a coil of a motor uses a sensefet current sensing device having a sense node and a source node. The source node is connected to deliver current to the coil, wherein a "sense" current proportional to said delivered current is produced on the sense node. An amplifier is connected to sense a voltage between said sense and source nodes to produce an output voltage to force a voltage on the sense node to be the same as a voltage on the source node. A pass element is connected to route said "sense" current to an output node. The circuit produces an output that is suitable for use as a feedback signal in a motor control system.

8 Claims, 3 Drawing Sheets

CIRCUIT FOR PROVIDING DRIVE CURRENT TO A MOTOR USING A SENSEFET CURRENT SENSING DEVICE AND A FAST AMPLIFIER

BACKGROUND OF THE INVENTION

1. Field of the Invention

This invention relates to improvements in circuitry for sensing and amplifying electronic signals, and more particularly to a circuit that uses a sensefet to sense the current flowing through the stator coil of a polyphase motor and a fast amplifier for amplifying the sensefet output voltage, and still more particularly to improvements in motor driver circuits for polyphase dc motors.

2. Description of the Prior Art

Although the present invention is potentially useful for a variety of current-sensing applications, it finds particular application in the operation of three-phase dc motors of the type typically used in computer-related applications. These computer applications include hard disk drives, CD ROM drives, floppy disks, and the like, in which three phase brushless, sensorless dc motors are becoming more popular, principally due to their reliability, low weight, and accuracy.

To control the motor speed, a transconductance loop is usually used in the driver stage to obtain good regulation. Therefore, a need exists to measure accurately the current through each coil of a polyphase motor.

One device that has been recently advanced to perform a measuring function in other applications is the sensefet, a field-effect transistor designed for current sensing, particularly with high power loads. A sensefet typically presents an output, called "sense," that provides a current proportional to the current in the main device. When a sensefet approach is used to monitor current on a power conductor, it may be important for the particular application to have a very fast amplifier to convert the "sense" current into a voltage signal for further processing. For example, amplifier speed is important when the amplified voltage signal is used as feedback for a motor control loop. In motor control loops, an appreciable delay in the signal may cause a significant error in the output of the loop.

What is needed is a circuit that will quickly respond to the input voltage presented on the output of an N-channel D-MOS FET or similar device when that device is used as a "high-side" driver (i.e., one that sources current to the load). The output voltage is generally available on a resistor connected to a reference potential or to the lower supply rail.

Until now amplifiers built in a standard power integrated circuit technology have been too slow to be useful for feedback loops, and have had bandwidths that are too small. Fast single-gain-stage amplifiers have had gains that are too low to yield acceptable operating precision, and either would not operate or have not had a fast recovery when overload voltages have occurred. (An overload voltage occurs when voltage to be sensed is greater than the amplifier supply voltage $V_{CC}$.)

Accordingly, the amplifier should have an input common mode voltage range compatible with (i.e., greater than) the supply voltage, to prevent saturation of the input stage. The amplifier should be a single-gain-stage amplifier. Therefore, no compensation capacitors are required and the device can be easily and inexpensively integrated onto an integrated circuit device. Also, it should be easy to connect the amplifier in parallel with other amplifiers of the same type. In this way, the current can be sensed on multiple stages and summed, giving a measure of the total current drawn by the stator coils at any particular time.

SUMMARY OF THE INVENTION

Considering the above, therefore, it is an object of the invention to provide an improved motor driver circuit.

It is another object of the invention to provide an improved circuit for quickly and accurately converting the "sense" current of a sensefet into a voltage signal for further processing.

It is another object of the invention to provide an improved apparatus and method of the type described that is suitable for use in the feedback path of a control loop.

It is still another object of the invention to provide an improved apparatus and method of the type described that will not cause significant error in the operation of the feedback loop.

It is another object of the invention to provide an improved apparatus and method of the type described that will have at least a 1 MHz large signal bandwidth when built with a standard bipolar integrated circuit technology.

It is still another object of the invention to provide an improved apparatus and method of the type described that has an open loop gain of greater than 50 db with a precision of better than one percent.

It is still another object of the invention to provide an improved apparatus and method of the type described that has a fast recovery from overload voltages presented to the amplifier by the sensefet output.

It is still another object of the invention to provide an improved apparatus and method of the type described that is a single-gain-stage device and therefore requires no compensation capacitors, allowing for easy and inexpensive integration onto an integrated circuit device.

It is yet another object of the invention to provide an improved apparatus and method of the type described in which multiple fast amplifiers can be easily connected in parallel so that the currents of multiple phases can be measured and summed, giving a measure of the total motor current at any particular instant.

These and other objects, features, and advantages of the invention will be apparent to those skilled in the art from the following detailed description of the invention, when read with the accompanying drawings and appended claims.

According to a broad aspect of the invention, a circuit for providing drive current to a coil of a motor is presented. The circuit includes a sensefet current sensing device connected to sense current delivered to the coil and to output a "sense" current proportional to the current delivered to the load. An amplifier is connected to impose the voltage at the load output onto the "sense" terminal. A pass transistor is connected to route the "sense" current to an output node. The circuit provides an output voltage suitable for use as feedback signal in a motor control system.

BRIEF DESCRIPTION OF THE DRAWINGS

The invention is illustrated in the accompanying drawings, in which.

In the various figures of the drawings, like reference numerals denote like or similar parts.

DETAILED DESCRIPTION OF THE PREFERRED EMBODIMENT

Figure 1:
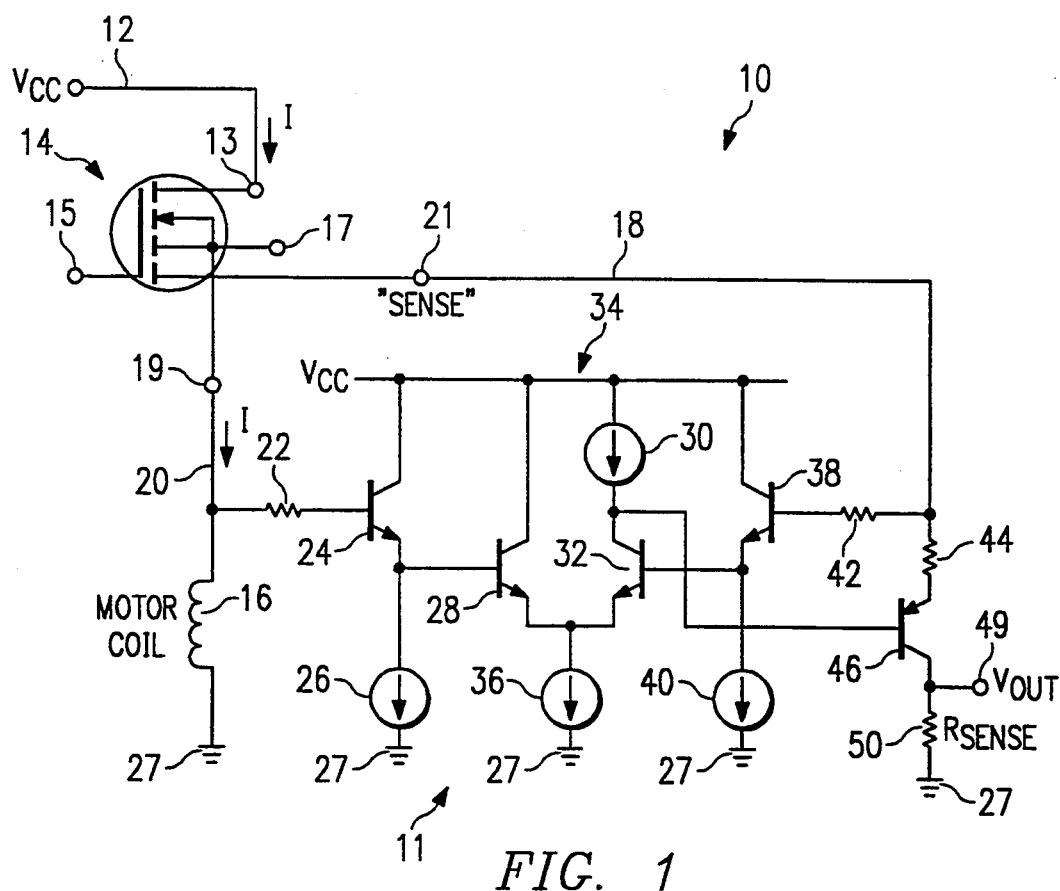
FIG. 1 is an electrical schematic diagram of a portion of a motor driver circuit incorporating a sensefet, as a high-side motor driver, and a fast amplifier, according to a preferred embodiment of the invention.

An electrical schematic of a sensefet and fast amplifier circuit 10 according to a preferred embodiment of the invention is shown in FIG. 1. (A sensefet is a modified FET optimized for a current sensing role, an example of which is a device type MTP10N10M distributed by Motorola; however, many different sensefet-type devices can be employed in this capacity.) Although the circuit 10 can be constructed of discrete components, preferably, it is integrated onto a single semiconductor chip that can be adapted for connection to a stator coil of a three-phase dc motor. Such motor can be preferably used, for example, in systems such as computer hard disk drives, CD ROM drives, floppy disk drives, and the like.

Such motors typically have a plurality of stator coils, and the need often arises to monitor the current flow at a particular time through some or all the stator coils. For example, such current information may be used as a feedback signal for a current control loop. A sensefet device on a conductor carrying the current to be monitored detects this current information. Such sensefet device provides an output "sense" current on a "sense" terminal that is proportional to the current flowing through the power device. To maximize the accuracy of proportionality, the "sense" terminal should be held at the same potential as the source terminal.

When using a sensefet to monitor current on a power conductor, it may be necessary that the response of the circuit be fast for further processing. Such speed may be important, for instance, when the "sense" current is to be used as a feedback signal in a control loop, such as a motor speed-control loop. In speed control loops, a significant time delay in the signal may introduce an unacceptable error into the output of the feedback loop.

The circuit 10 of FIG. 1 extracts current information from the "sense" output 21 of an N-channel D-MOS sensefet 14 or a similar device, with the sensefet 14 used as a "high-side" driver (i.e., it sources current to the load). When the sensefet 14 is used as such a high-side driver, it is important that the amplifier 11 have an input common-mode voltage range compatible with the positive supply (i.e., greater than the supply potential).

The drain terminal 13 of the sensefet 14 is connected on line 12 to $V_{CC}$ and carries current for delivery to the stator coil 16. The gate terminal 15 is connected to a predriver circuit (not shown), and the "sense" output terminal 21 on which the "sense" current flows is connected to the input line 18 of the fast amplifier 11. The source terminal 19 is connected to the conductor 20 that provides a second input to the amplifier 11 and carries current to the stator coil 16 of the motor. The Kelvin source contact terminal 17, when available, can be connected to the second input of the amplifier instead, to maximize accuracy. The sensefet 14 thus serves to sense the current through the conductor 12.

The predriver circuit connected to the gate terminal 15 drives the sensefet 14 into full conduction, or low impedance, so that the current flows through the drain and the source to power the stator coil 16. The "sense" output 21 of the sensefet 14 is a "sense" current that is proportional to the amount of current flowing through the "power" source terminal 19.

As mentioned previously, the "sense" output terminal 21 of the sensefet 14 presents the $V_{SOURCE}$ signal to the input line 18 of the fast amplifier 10 for amplification. Connected to the input line 18 is a first end of a resistor 42. The other end of the resistor 42 is connected to the base of an NPN transistor 38. The collector of the transistor 38 is connected to $V_{CC}$, and the emitter is connected to a current source 40 that is connected to a reference potential 27.

A differential amplifier 34 is formed by two NPN transistors 32 and 28, the collector of the transistor 32 being connected to a current source 30 that is connected to $V_{CC}$. The collector of the NPN transistor 28 is connected directly to $V_{CC}$. The emitters of both of the transistors 32 and 28 are connected to a current source 36, which is connected to the reference potential 27. The base of the NPN transistor 28 is connected to the emitter of another NPN transistor 24. The transistor 24 has its collector connected to $V_{CC}$ and its emitter connected to a current source 26 that is connected to the reference potential 27. (The current sources 30, 26, 36, and 40 are typical internal components of operational amplifiers, as known in the art, for generating biasing currents necessary for the operation of the circuit.)

A resistor 22 has a first end connected to the base of the NPN transistor 24 and a second end to the source terminal 19 of the sensefet 14. In addition, one end of a resistor 44 is connected to the input line 18 of the fast amplifier 11 and other end is connected to the emitter of an output PNP transistor 46. The transistor 46 has its base connected to the collector of the NPN transistor 32 and its collector connected to a first end of a sense resistor, $R_{SENSE}$ 50. The sense resistor 50 has its other end connected to the reference potential 27. The output terminal 49 at which the output voltage ($V_{OUT}$) appears is connected to $R_{SENSE}$ 50 and the collector of the transistor 46.

Figure 2:
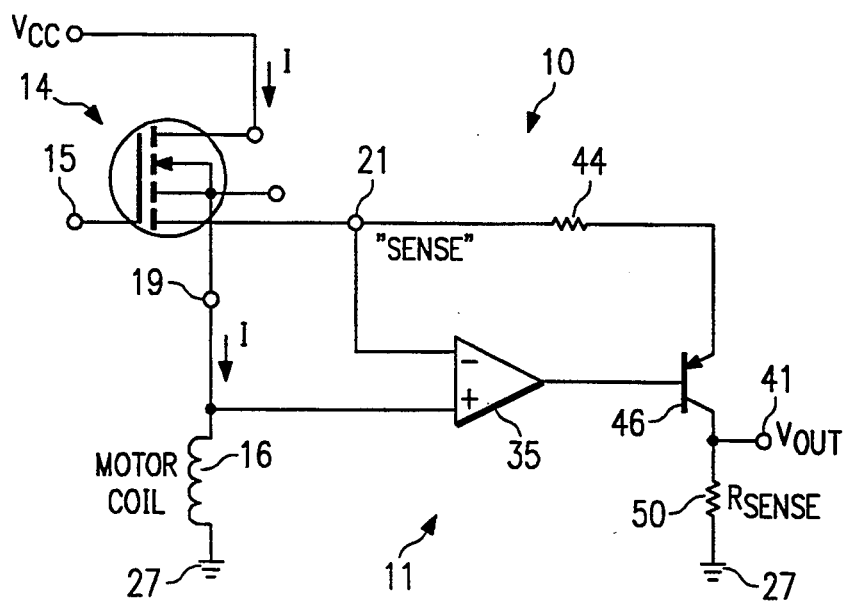
FIG. 2 is a simplified electrical schematic block diagram of an equivalent circuit for the preferred embodiment of the invention of FIG. 1.

An equivalent schematic for the circuit of FIG. 1 is shown in FIG. 2. In the FIG. 2 circuit, the portion of the fast amplifier 11 exclusive of the output PNP transistor 46, the sense resistor 50, resistor 44, and the output terminal 49 is replaced by an operational amplifier 35.

The inverting input of the operational amplifier 35 is connected to the "sense" output terminal 21 of the sensefet 14, and the non-inverting input is connected to the source terminal 19 of the sensefet 14 and to the stator coil 16.

The output of the operational amplifier 35 is connected to the base of the pass PNP transistor 46. The pass transistor 46 has its emitter connected to the "sense" output terminal 21 of the sensefet 14 through the resistor 44. The collector of the pass transistor 46 is connected to the output terminal 49 and one end of $R_{SENSE}$ 50. The other end of $R_{SENSE}$ 50 is connected to the reference potential 27.

Figure 3:
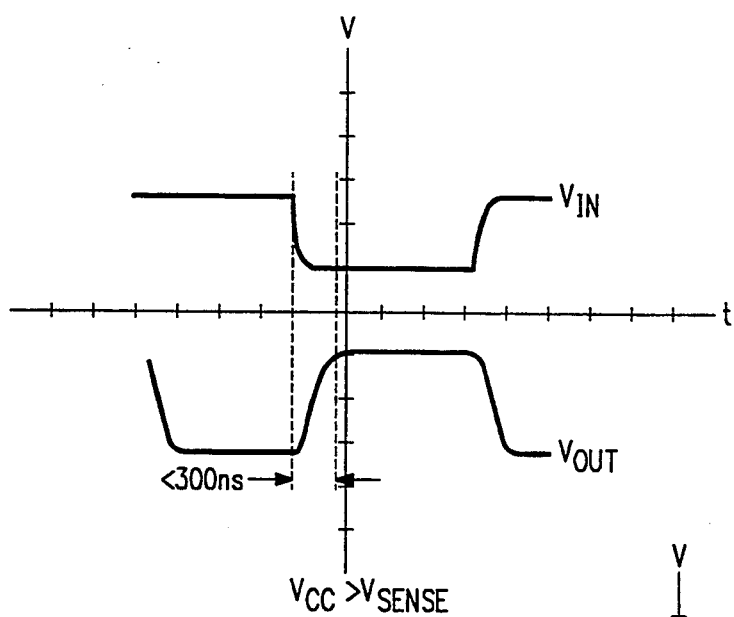
FIG. 3 is an electronic signal diagram plotting the input signal to the amplifier with the output signal from the amplifier for the condition in which the input to the amplifier (i.e., $V_{SOURCE}$, the voltage on the source of the device) is less than the supply voltage $V_{CC}$.
Figure 4:
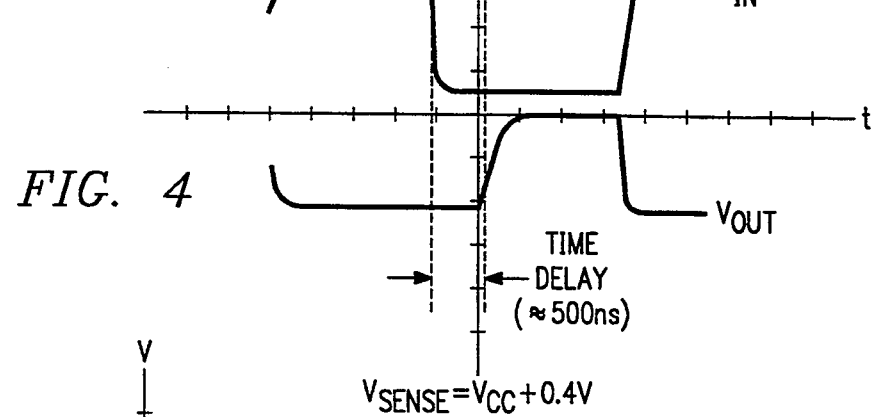
FIG. 4 is an electronic signal diagram also showing the amplifier input and output signals for an overdrive input voltage ($V_{SOURCE}$) 0.4 volts greater than the supply voltage.
Figure 5:
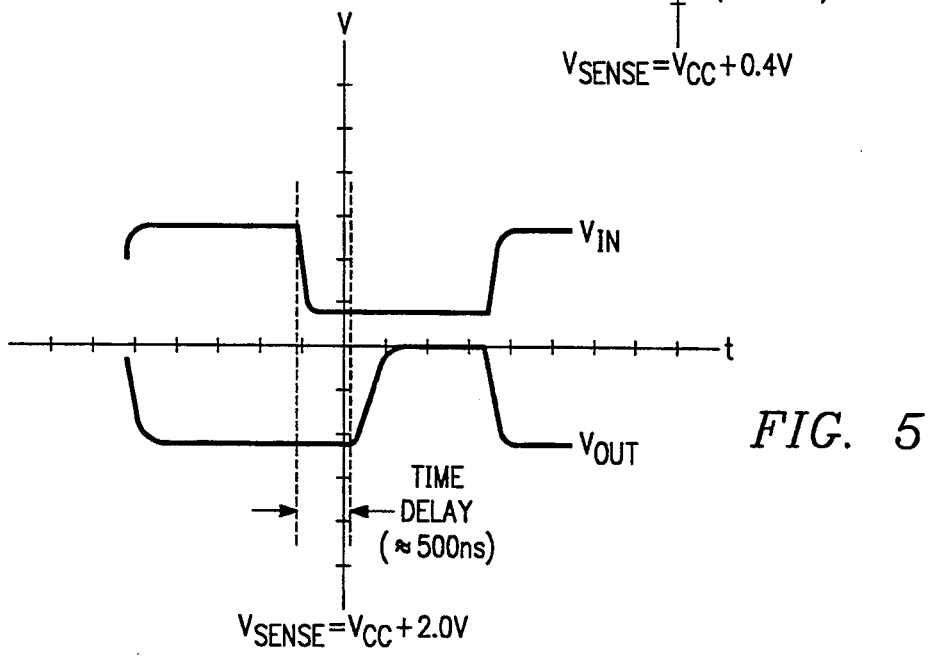
FIG. 5 is an electronic signal diagram also showing the input and output voltages of the amplifier for an overdrive input voltage ($V_{SOURCE}$) 2.0 volts greater than the supply voltage.
Figure 6:
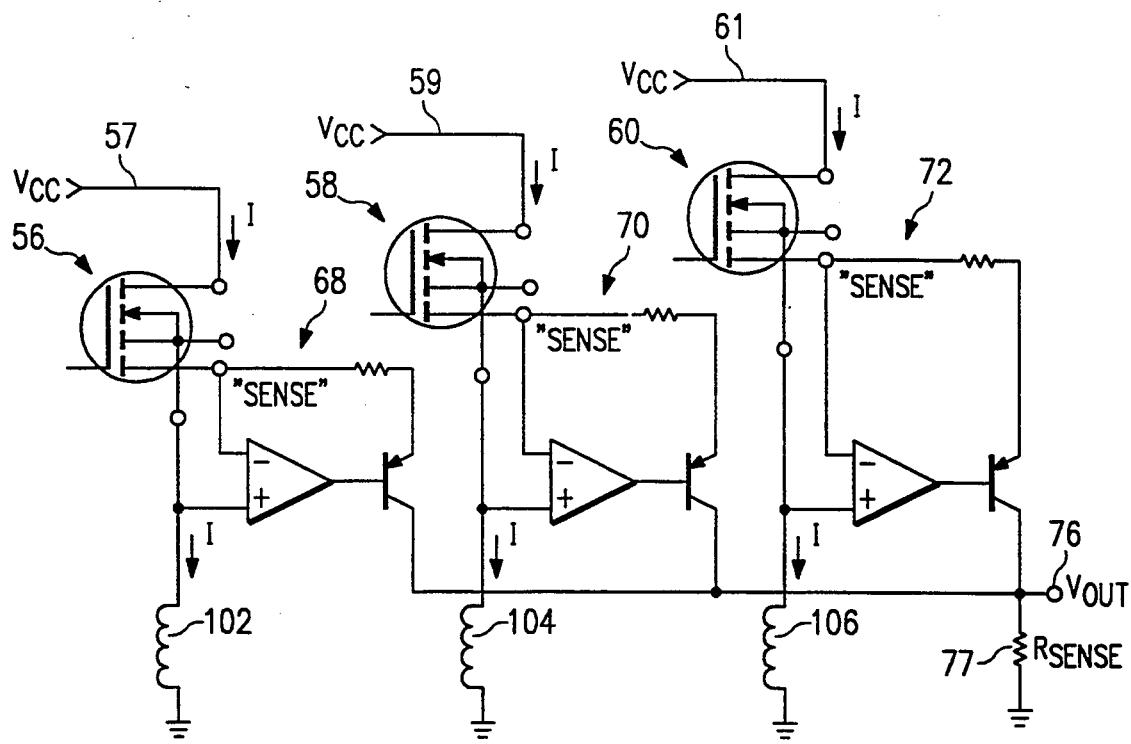
FIG. 6 is an electronic schematic diagram of a system of multiple sensefets and fast-amplifiers in which a plurality of fast-amplifiers are connected onto a single output, used for sensing the current through multiple conductors and presenting an output voltage representing the sum of the currents sensed.

As mentioned, the fast amplifier 11 has a good response to input voltages ($V_{SOURCE}$) greater than $V_{CC}$. The response of the fast amplifier 11 to various voltage conditions is shown in FIGS. 4, 5, and 6. The technology used is a low performance one and offers vertical NPN transistors of $F_{T\,Max}$=200 mHz and lateral PNP transistors with $F_{T\,Max}$=12 mHz. Better performances can be obtained with a more sophisticated technology. FIG. 3 shows the results in which the input voltage ($V_{SOURCE}$) is always lower than $V_{CC}$, which would be the normal operating condition for most amplifiers. The output waveform, $V_{OUT}$, of the fast amplifier 11 closely tracks the input waveform $V_{IN}$ (i.e., $V_{SOURCE}$ from the sensefet 14) with a rise time of about 300 ns.

The $V_{OUT}$ waveform is inverted with respect to the input waveform. The time scale of the particular waveforms is 500 nanoseconds per division. The x-axis is not necessarily a zero voltage level. The drawing shows the way the two signals are simultaneously displayed on the oscilloscope.

FIG. 4 shows the circuit response, or recovery from overload, when $V_{SOURCE}$ jumps down from 0.4 volts above $V_{CC}$. It should be noted that the output signal, $V_{OUT}$, does not track the input signal $V_{IN}$ as closely as it was in FIG. 1. In this case there is a greater time delay (about 500 ns) in changing states. As before, the $V_{OUT}$ waveform is an inversion of the $V_{IN}$ waveform. The horizontal divisions are 500 nanoseconds. Again, the x-axis is not necessarily a zero voltage level.

FIG. 5 shows the circuit response in which $V_{SOURCE}$ recovers from exceeding the voltage supply by 2.0 volts, and in which there is again a time delay (around 500 nanoseconds). The horizontal divisions are 500 nanoseconds. The $V_{OUT}$ waveform is inverted with respect to the $V_{IN}$ waveform, and again the x-axis is not necessarily a zero voltage level.

From the above, it will be appreciated that the amplifier 11 has its inputs compatible with operation at or above the positive supply. It has a fast recovery from voltages above the supply, which is useful for inductive loads (i.e., stator coils) due to possible over-voltages due to current recirculation.

The circuit is very fast and has a well behaved response due to a single-gain-stage design in which all the active components in the signal path are NPN transistors, except the output PNP transistor. It does not require any compensation capacitors due to the single-gain-stage architecture and uses only a few components. The circuit, therefore may be easily and cheaply integrated onto an integrated circuit device.

It should be noted that all three resistors 22, 42, and 44 in the circuit can be of zero value; i.e., the resistors can be removed without affecting the operation of the circuit. Their presence in the embodiment illustrated is favored mostly due to reliability considerations in some environments.

The precision of the circuit 10 is better than 1% due to the relatively high open-loop gain, which may be in excess of 50 db with a standard bipolar technology. An added feature of the invention is the ease of placing the outputs of multiple sensing amplifiers onto a single resistor. This is because the outputs are provided on the collectors of the pass PNP transistor of each device. This embodiment is shown in FIG. 6. Three fast amplifiers 68, 70, and 72, receive their respective $V_{SOURCE}$ signals from their respective sensefets 56, 58, and 60. Each sensefet 56, 58, and 60 senses the current through respective three different conductors 57, 59, and 61. The three fast amplifiers 56, 58, and 60 have their outputs placed onto a single resistor $R_{SENSE}$ 77, to give a single output. The sensefets 57, 59, and 61 are connected to their respective amplifiers 68, 70, and 72, their respective conductors 57, 59, and 61, and their respective stator coils 102, 104, and 106 in the same way as the sensefet 14 is connected to its various connections in FIG. 1. While the use of three such amplifiers may be typical, since many motors have three phases, the idea is not intended to be limited to the use of three fast amplifiers, and as many may be used as required.

In applications such as multi-phase motor operation, the embodiment of FIG. 6 generates a $V_{OUT}$ signal on the terminal 76 of the sense resistor 77. The $V_{OUT}$ signal is proportional to the sum of the currents sensed in the different stator coils 102, 104, and 106. This is indicative of the total current drawn by the motor.

Figure 7:
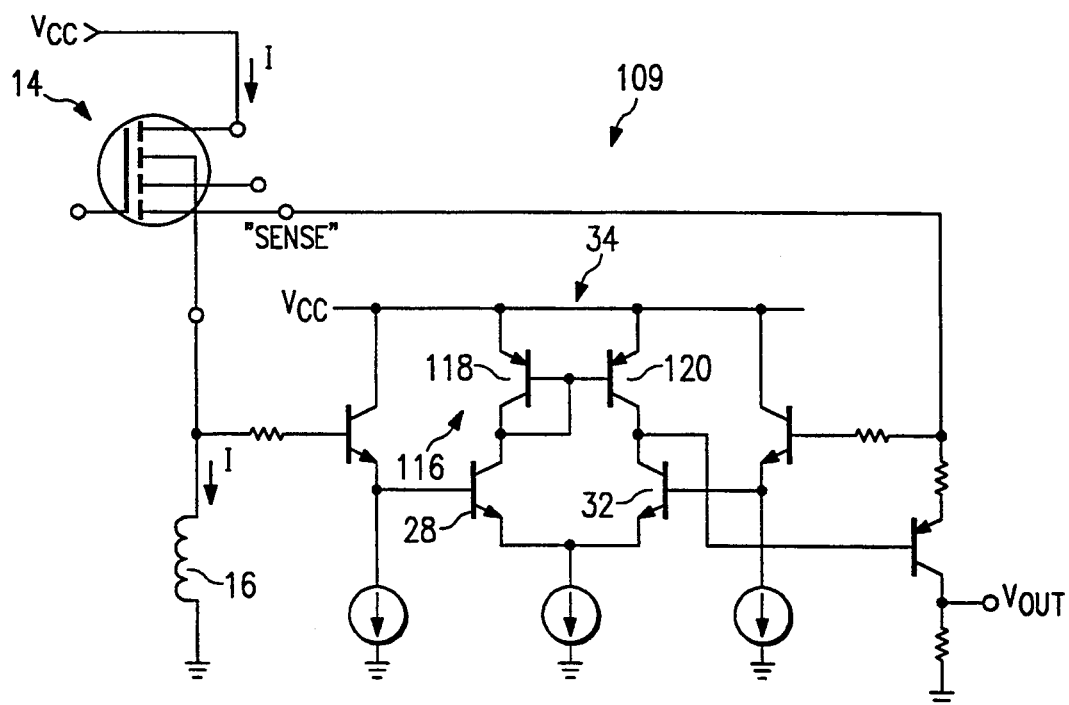
FIG. 7 is an electrical schematic diagram of another embodiment of a sensefet and fast amplifier circuit including additional components forming current-mirroring circuitry in the differential stage to alter circuit performance.

FIG. 7 shows another embodiment of a sensefet and fast amplifier circuit 109 in which the differential state includes current-mirroring circuitry 116. Except the absence of the current generator and the addition of a current mirror circuit, as discussed below, the circuit of FIG. 7 is similar to the FIG. 1 circuit embodiment.

In the embodiment of FIG. 7 a PNP current-mirror circuit 116 having PNP transistors 118 and 120 has been added to the circuit of the FIG. 1 embodiment. The emitter of PNP transistor 120 is connected to $V_{CC}$, and the collector is connected to the collector of the NPN transistor 32. The transistor 118 has its emitter connected to $V_{CC}$ and its collector connected to the collector of the NPN transistor 28. The base of the PNP transistor 118 is connected to the base of the PNP transistor 120 and to the collector of the PNP transistor 118.

Although the FIG. 7 embodiment has lower offsets in the differential amplifier 34 than the circuit of FIG. 1, it may not provide the dynamic performance of the FIG. 1 embodiment. This is because when low performance lateral PNP transistors are used the PNP current mirror 116 creates a greater phase shift, degrading the phase margin and stability. A compensation network, as known in the art, may be employed to alter the frequency response accordingly.

The circuit shown may be also applied for current sensing when other power transistors and drivers are used, so that p-channel devices and bipolar structures may be adopted instead of sensefet transistor 14. Also, two resistors connected on one side to $V_{CC}$ and on the other side, respectively, to terminals 19 and 21 may be substituted for the sensefet 14, still preserving the functionality of the current sensing amplifier.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

I claim:

1. A circuit for providing drive current to a coil of a motor, comprising:
    a sensefet current sensing device having a sense node and a source node, said source node being connected to deliver current to said coil, wherein a sense current proportional to said delivered current is produced on the sense node;
    a differential amplifier connected to sense a voltage between said sense node and source node to produce an output based upon said voltage,
    a pass element controlled by said output of said amplifier and connected to route said sense current to an output node, to produce an output voltage to force a voltage on the sense node to be substantially the same as a voltage on the source node;
    wherein the differential amplifier comprises:
        a first resistor having a first end connected to the sense output of the sensefet current sensing device;
        a first NPN transistor having a base connected to a second end of said first resistor, a collector connected to a voltage supply, and an emitter connected to a first current generator that is connected to a reference potential;
        a second NPN transistor, having a collector connected to a second current generator that is connected to said voltage supply, an emitter connected to a third current generator connected to the reference potential, and a base connected to the emitter of the first NPN transistor;
        a third NPN transistor having a collector connected to said voltage supply, an emitter connected to said third current generator, and a base;
        a fourth NPN transistor having a collector connected to said voltage supply, an emitter connected to the base of said third NPN transistor and a fourth current generator, said forth current generator also being connected to the reference potential;
        a second resistor having a first end connected to the base of said fourth NPN transistor and a second end connected to the source output of said sensefet current sensing device;
    and wherein the circuit further comprises:
        a third resistor having a first end connected to the first end of the first resistor, and a second end;
        a fourth resistor having a first end connected by said pass element to the second end of said third resistor, and a second end connected to the reference potential; and
        an output terminal connected to said first end of said fourth resistor.

2. The circuit of claim 1 wherein said pass element comprises a PNP transistor.

3. The circuit of claim 2 wherein said PNP transistor has an emitter connected to the second end of said third resistor, a base connected to the collector of said second NPN transistor, and a collector connected to the first end of said fourth resistor and said output terminal.

4. A circuit for providing drive current to a coil of a motor, comprising:
    a sensefet current sensing device having a sense node and a source node, said source node being connected to deliver current to said coil, wherein a sense current proportional to said delivered current is produced on the sense node;
    a differential amplifier connected to sense a voltage between said sense node and source node to produce an output based upon said voltage,
    a pass element controlled by said output of said amplifier and connected to route said sense current to an output node, to produce an output voltage to force a voltage on the sense node to be substantially the same as a voltage on the source node;
    wherein the differential amplifier comprises:
        a first NPN transistor having a base connected to the sense output of the sensefet current sensing device, a collector connected to a voltage supply, and an emitter connected to a first current generator that is connected to a reference potential;
        a second NPN transistor, having a collector connected to a second current generator connected to said voltage supply, an emitter connected to a third current generator connected to the reference potential, and a base connected to the emitter of the first NPN transistor;
        a third NPN transistor having a collector connected to said voltage supply, an emitter connected to said third current generator, and a base;
        a fourth NPN transistor having a base connected to the source output of said sensefet current sensing device, a collector connected to said voltage supply, an emitter connected to the base of said third NPN transistor and a fourth current generator, said fourth current generator also being connected to the reference potential;
    and wherein the circuit further comprises:
        a sense resistor having a first end connected by said pass element to the sense output of the sensefet current sensing device and a second end connected to the reference potential; and
        an output terminal connected to said first end of said sense resistor.

5. A circuit for providing drive current to a plurality of coils of a motor, comprising:
    a plurality of sensefet current sending devices each having a sense node and a source node, each of said source nodes being connected to deliver current to a respective one of said coils, wherein sense currents proportional to said delivered currents are produced on respective sense nodes, wherein each of said sensefet current sensing devices has a source connected at said source node to the respective coil, a gate connected to a predrive output voltage, a drain connected to a motor drive signal source, and a sense output connected to an input of a respective one of said amplifiers;
    a plurality of differential amplifiers each connected to sense a voltage between said sense and source nodes of respective ones of said sensefet current sensing devices to produce and putput boltage based upon the voltage sensed:
    a plurality of pass elements each controlled by said output voltage of a respective one of said amplifiers for routing the respective sense currents to an output node to force a voltage on the respective sense nodes to be the same as the voltage on the respective source nodes;

wherein each of said sensefet current sensing devices has a source connected at said source node to the respective coil, a gate connected to a predrive output voltage, a drain connected to a motor drive signal source, and a sense output wherein each of said differential amplifiers comprises:

- a first resistor having a first end connected to the sense output of the respective sensfet current sensing device;
- a first NPN transistor having a base connected to a second end of said first resistor, a collector connected to a voltage supply, and an emitter connected to a first current generator that is connected to a reference potential;
- a second NPN transistor having a collector connected to a second current generator connected to said voltage supply, an emitter connected to a third current generator connected to the reference potential, and a base connected to the emitter of the first NPN transistor;
- a third NPN transistor having a collector connected to said voltage supply, an emitter connected to said third current generator, and a base;
- a fourth NPN transistor having a collector connected to said voltage supply, an emitter connected to the base of said third NPN transistor and a fourth current generator, said current generator also being connected to the reference potential;
- a second resistor having a first end connected to the base of said fourth NPN transistor and a second end connected to the source of said respective sensfet current sensing device;

and wherein the circuit further comprises:

- a third resistor having a first end connected to the first end of the first resistor, and a second end;
- a fourth having a first end connected by said pass element to the second end of said third resistor, and a second end connected to the reference potential; and
- an output terminal connected to said first end of said fourth resistor.

6. The circuit of claim 5 wherein each of said pass elements comprises a PNP transistor.

7. The circuit of claim 6 wherein said PNP transistor has an emitter connected to the second end of said third resistor, a base connected to the collector of said second NPN transistor, and a collector connected to the first end of said fourth resistor and said output terminal.

8. A circuit for providing drive current to a plurality of coils of a motor, comprising:

a plurality of sensefet current sensing devices each having a sense node and a source node, each of said source nodes being connected to deliver current to a respective one of said coils, wherein sense currents proportional to said delivered currents are produced on respective sense nodes, a plurality of amplifiers each connected to sense a voltage between said sense and source nodes of respective ones of said sensfet current sensing devices to produce an output voltage based upon the voltage sensed;

a plurality of pass elements each controlled by said output voltage of a respective one of said amplifiers for routing the respective sense currents to an output node to force a voltage on the respective sense nodes to be the same as the voltage on the respective source nodes;

wherein each of said sensefet current sensing devices has a source connected at said source node to the respective coil, a gate connected to a predrive output voltage, a drain connected to a motor drive signal source, and a sense output;

wherein each of said differential amplifiers comprises:

- a first NPN transistor having a base connected to the sense output of the respective sensefet current sensing device, a collector connected to a voltage supply, and an emitter connected to a first current generator that is connected to a reference potential;
- a second NPN transistor, having a collector connected to a second current generator connected to said voltage supply, an emitter connected to a third current generator connected to the reference potential, and a base connected to the emitter of the first NPN transistor;
- a third NPN transistor having a collector connected to said voltage supply, an emitter connected to said third current generator, and a base;
- a fourth NPN transistor having a collector connected to said voltage supply, an emitter connected to the base of said third NPN transistor and a fourth current generator, said current generator also being connected to the reference potential, and a base connected to the source of said respective sensefet current sensing device;

and wherein the circuit further comprises:

a sense resistor having a first end connected by said pass element to the sense node of said sensefet current sensing device and a second end connected to the reference potential; and an output terminal connected to said first end of said sense resistor.

* * * * *